United States Patent

Chow et al.

[11] Patent Number: 5,815,043
[45] Date of Patent: Sep. 29, 1998

[54] FREQUENCY CONTROLLED RING OSCILLATOR HAVING BY PASSABLE STAGES

[75] Inventors: Wing Hong Chow; Robert L. Bailey, both of San Jose, Calif.

[73] Assignee: Apple Computer, Inc., Cupertino, Calif.

[21] Appl. No.: 800,160

[22] Filed: Feb. 13, 1997

[51] Int. Cl.⁶ ..................................................... H03B 27/00
[52] U.S. Cl. ........................................ 331/57; 331/108 C
[58] Field of Search .................................. 331/57, 49, 60, 331/108 C

[56] References Cited

U.S. PATENT DOCUMENTS

| | | | |
|---|---|---|---|
| 4,105,950 | 8/1978 | Dingwall | 331/57 |
| 5,262,735 | 11/1993 | Hashimoto et al. | 331/45 |
| 5,418,499 | 5/1995 | Nakao | 331/57 |
| 5,471,176 | 11/1995 | Henson et al. | 331/1 A |

*Primary Examiner*—David C. Nelms
*Assistant Examiner*—Hoai Ho
*Attorney, Agent, or Firm*—Beyer & Weaver, LLP

[57] ABSTRACT

An improved ring oscillator in which frequency drift is controlled to provide reasonable accuracy is disclosed. The improved ring oscillator eliminates the frequency drift due processing variances. The ring oscillator provided by the invention incurs substantially less frequency drift than a conventional ring oscillator, but the frequency of the ring oscillator is still dependent on temperature and voltage changes. The improved ring oscillator according to the invention is particularly suited for operating as a localized oscillator that is used to facilitate periodic refreshing of DRAM within a computer.

22 Claims, 7 Drawing Sheets

FREQUENCY CONTROLLED RING OSCILLATOR HAVING BY PASSABLE STAGES

BACKGROUND OF THE INVENTION

1. Field of the Invention

The present invention relates to ring oscillators, and more particularly, to frequency controllable ring oscillators.

2. Description of the Related Art

Computer systems typically used oscillators to control and synchronize various circuitry within the computer systems. Typically, the oscillators are crystal oscillators or Phase-Locked-Loop (PLL) oscillators. Crystal oscillators are known to be very accurate and reliable but consume a significant amount of power. PLL oscillators also have good accuracy but require a large amount of gates to implement.

In most computer systems, Dynamic Random Access Memory (DRAM) is used as a primary memory component of the computer system. A physical characteristic of DRAM is that its memory cells need to be refreshed at a specific time intervals to preserve the data. Although there now exists self-refreshing DRAM that internally includes the circuitry necessary to perform the refreshing, the self-refreshing type of DRAM is typically more expensive and its availability is problematic.

Ring oscillators are another type of oscillator. However, since ring oscillators are known to be inaccurate and unstable, ring oscillators are of limited usefulness in computer systems where accuracy and stability are generally necessary. FIG. 1 is a schematic diagram of a conventional ring oscillator 100. The conventional ring oscillator 100 includes an odd number of inverters 102 connected in series followed by a buffer 104. The output of the last of the inventors 102 in the series is feedback to the input of the first of the inventors 102 in the series. In other words, a ring oscillator typically includes an odd number of inverters connected in series with its output feed back to the input of the first inverter so as to form a ring.

Conventional ring oscillators have several problems which make them generally unsuitable for use in most computer system operations. A major problem associated with conventional ring oscillators is their inability to maintain a stable frequency. In particular, the frequency with which a ring oscillator operates varies as much at 80% in fabricated semiconductor chips (or dies) due to various processing variations. Another problem of ring oscillators is that the frequency varies with temperature and voltage. Namely, as temperature of the ring oscillator increases, the frequency of the ring oscillator slows; and as the voltage supplied to the ring oscillator increases, the frequency of the ring oscillator increases.

A portable computer system typically has a number of operating modes, including an active mode and a sleep mode. In the active mode, the portable computer system executes program code as directed by a user. In the sleep mode, a least a portion of the circuitry within the portable computer system is shut down or placed in a low power state so that the portable computer system is able to reduce power consumption and thereby extend battery life. More advanced portable computer systems even shut down a main reference clock of the portable computer system. The main reference clock is normally produced by a crystal oscillator. As previously noted, crystal oscillators are accurate but consume a significant amount of power. Hence, by shutting down the main reference clock (i.e., crystal oscillator) to save power, the main reference clock is not available during the sleep mode. As a result, there must be another clock or oscillator to time the refreshing operation of the DRAM. Conventional approaches, therefore, either do not shut down the crystal oscillator and consume relatively large amounts of power or do shut down the crystal oscillator and use self-refreshing DRAM.

Unfortunately, both these conventional approaches have significant disadvantages. The conventional approach using self-refreshing DRAM is significantly more expensive because the cost of the self-refreshing DRAM is higher than the cost of non-self-refreshing DRAM. The disadvantage of the other conventional approach is that it consumes too much power to be a satisfactory solution. For example, if a user of a portable computer system where to have its system in the sleep mode for an extended period of time (e.g., a few days), then the crystal oscillator would consume all the energy the battery of the portable computer system would provided. Once the battery is drained, all Random Access Memory (RAM) resident data the user had on the portable computer system is lost and the portable computer system shuts off. Thereafter the user cannot simply return to the active mode from the sleep mode, but must instead reboot the system.

Thus, there is a need for an oscillator design suitable for refreshing of DRAM while utilizing very little power so that battery power is better preserved while a computer system is in a sleep mode.

SUMMARY OF THE INVENTION

Broadly speaking, the invention pertains to an improved ring oscillator in which frequency drift is controlled to provide reasonable accuracy. The improved ring oscillator according to the invention is particularly suited for operating as a localized oscillator that is used to facilitate periodic refreshing of DRAM within a computer.

The invention can be implemented in numerous ways, including as an apparatus, a computer system, and a method. Several embodiments of the invention are discussed below.

As a frequency controlled ring oscillator, an embodiment of the invention includes: a ring oscillator having a number of delay stages, the ring oscillator produces an output clock signal having an output frequency; a plurality of bypass switches, each of the bypass switches being coupled across one of the delay stages of the ring oscillator; and a controller for comparing the output frequency of the output clock signal with a reference frequency to produce a comparison result, and for opening or closing the bypass switches based on the comparison result. The opening or closing the bypass switches operates to alter (calibrate) the output frequency of the output clock signal.

As a computer, an embodiment of the invention includes: a DRAM for storing data; a crystal oscillator for producing a reference clock signal; a CPU having a sleep mode and an active mode, the CPU both processing program instructions and accessing data from the DRAM in accordance with the reference clock signal when in the active mode, and the CPU entering a low power state and not processing program instructions or accessing data in accordance with the reference clock signal when in the sleep mode; a memory controller for accessing and refreshing the DRAM, the memory controller including a frequency controlled ring oscillator that is used to periodically refresh the data stored in the DRAM when in the sleep mode; and a power manager for signaling the CPU, the crystal oscillator and the memory controller that the CPU is in, or is about to be placed in, the sleep mode.

As a method for refreshing a DRAM in a computer system having an active mode and a sleep mode, an embodiment of the invention includes the operations of: providing a ring oscillator having a plurality of bypassable delay stages, the ring oscillator produces a refresh clock; providing a reference clock throughout the computer system when in the active mode but not while in the sleep mode; prior to entering the sleep mode, calibrating the ring oscillator against the reference clock using the bypassable delay stages; and refreshing the DRAM in accordance with the reference clock when in the active mode and in accordance with the refresh clock when in the sleep mode.

The advantages of the invention are numerous. One advantage of the invention is that the ring oscillator according to the invention consumes relatively little power compared to conventional approaches. Another advantage of the invention is that ring oscillator according to the invention is inexpensive and easily fabricated. Another advantage of the invention is that the accuracy and drift of the ring oscillator according to the invention can be controlled to be within acceptable limits for certain applications in computer systems such as controlling timing of refreshing operations of DRAM while the computer system is in a sleep mode and a main reference clock is inactivated.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention pertains to an improved ring oscillator in which frequency drift is controlled to provide reasonable accuracy. The improved ring oscillator controls the frequency drift due processing variances. The ring oscillator provided by the invention incurs substantially less frequency drift than a conventional ring oscillator, but the frequency of the ring oscillator is still dependent on temperature and voltage changes. The improved ring oscillator according to the invention is particularly suited for operating as a localized oscillator that is used to facilitate periodic refreshing of DRAM within a computer.

Embodiments of the invention are discussed below with reference to FIGS. 2–8. However, those skilled in the art will readily appreciate that the detailed description given herein with respect to these figures is for explanatory purposes as the invention extends beyond these limited embodiments.

Figure 2:
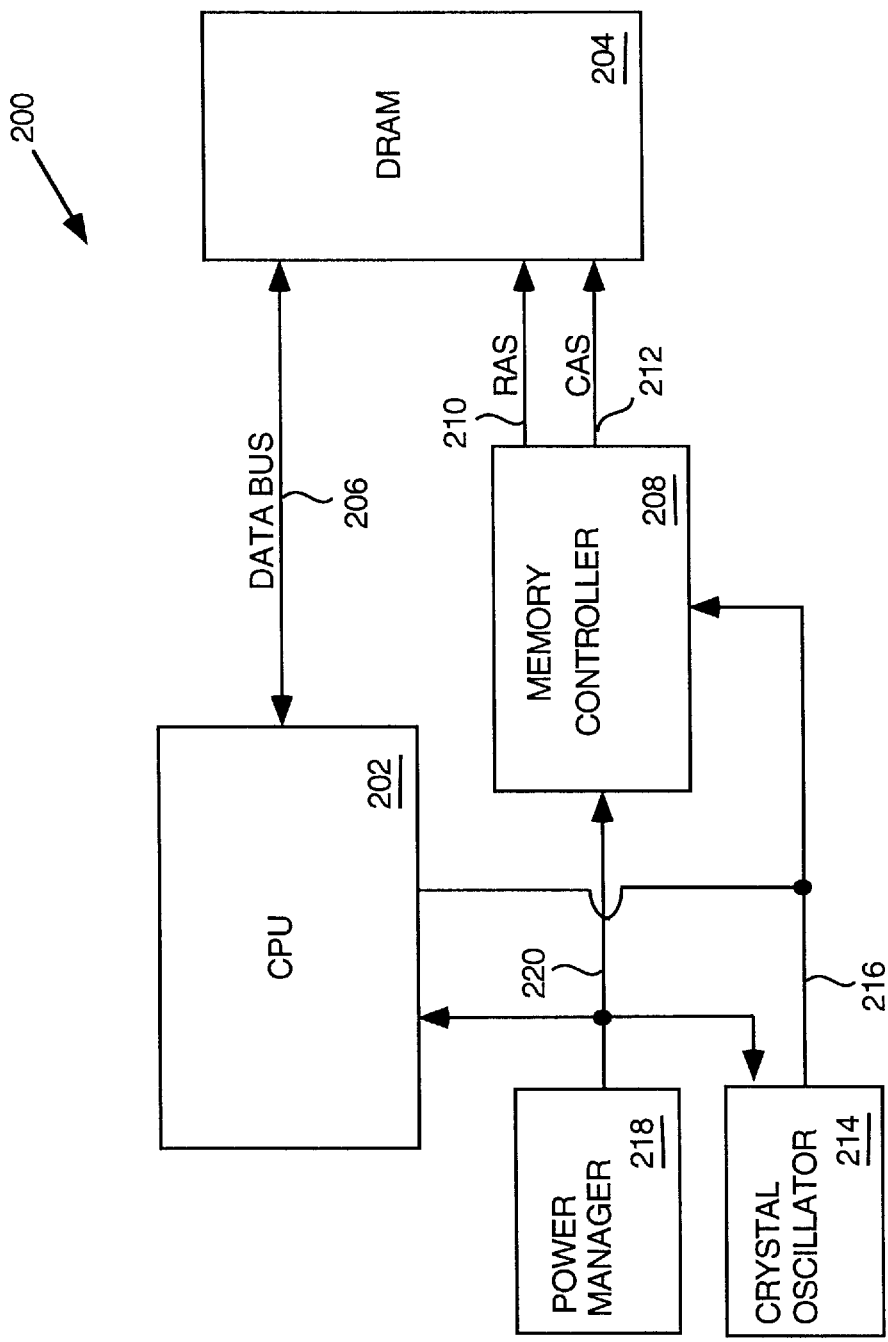
FIG. 2 is a block diagram of a portion of a computer system according to an embodiment of the invention.

FIG. 2 is a block diagram of a portion of a computer system 200 according to an embodiment of the invention. The computer system 200 includes a Central Processing Unit (CPU) 202, a Dynamic Random Access Memory (DRAM) 204, and a data bus 206 coupled between the CPU 202 and the DRAM 204. The computer system 200 also includes a memory controller 208 that generates row address select (RAS) signals 210 and column address select (CAS) signals 212 both of which are supplied to the DRAM 204. Further, the computer system 200 includes a crystal oscillator 214 that produces a reference clock that is supplied to the CPU 202 and the memory controller 208 over a clock signal line 216. Given that the reference clock is produced by the crystal oscillator 214, the reference clock is accurate and stable over large temperature and voltage ranges. A power manager 218 is also provided in the computer system 200 to control whether the CPU 202 and the memory controller 208 operate in an active mode or a sleep mode. The power manager 218 supplies a mode select signal to the CPU 202, the crystal oscillator 214 and the memory controller 208 over a mode signal line 220.

When the computer system 200 is placed in the active mode by the power manager 218, the CPU 202 operates to execute program instructions in accordance with the reference clock, and the memory controller 208 operates to not only access the DRAM 204 for the CPU 202 but also operate to refresh the DRAM so as to preserve the data stored therein. The memory controller 208 operations are performed in accordance with the reference clock when in the active mode. It is well known that given the physical properties of DRAM semiconductor chips (of the non-self-refreshing type), the data stored in the memory cells of the DRAM semiconductor chips must be periodically refreshed. Hence, when in the active mode, the memory controller 208 performs the needed refreshing of the data stored in the DRAM 204 by using timing that is provided by the reference clock.

When the computer system 200 is placed in the sleep mode by the power manager 218, the CPU 202 ceases to execute program instructions. The power manager 218 also causes the crystal oscillator 214 to be turned off (powered off) via the mode signal line 220 when the computer system is being placed in the sleep mode. By turning off the crystal oscillator 214 and the CPU 202 during the sleep mode, energy savings results. This energy savings is beneficial to the environment generally and, in the case of battery powered computers, prolongs battery life.

The memory controller 208 operates to include an internal clock. When the power manager 218 signals the memory controller 208 via the mode signal line 220 that the computer system 200 is entering the sleep mode, the memory controller 208 understands that the reference clock produced by the crystal oscillator 214 and supplied to the memory controller 208 through the reference clock signal line 216 will soon be turned off. Thereafter, the memory controller 208 operates using the internal clock to periodically refresh the memory cells within the DRAM 204 so that the data stored in the DRAM 204 is preserved.

The internal clock to the memory controller 208 is a ring oscillator according to the invention. The ring oscillator is controlled by dedicated hardware or software so that the frequency of the ring oscillator is controlled or calibrated such that processing variations are no longer problematic and frequency is sufficiently stable to control the timing for the refreshing function of the memory controller 208. When hardware is used to implement the control of the ring oscillator, the hardware can reside internal to the memory controller 208. On the other hand, when software is used to implement the control of the ring oscillator, the CPU 202 can execute the program instructions and interact with the ring oscillator through the memory controller 208.

It should be noted that the power manager 218 could be contained within the CPU 202. Also, although the sleep mode is described as being for the computer system 200, the sleep mode is often also considered a mode of a CPU. Hence, when the CPU is in the sleep mode, other devices within a computer system are also typically inactive, dormant or asleep. One way to put these other devices to sleep is to deactivate or turn off the crystal oscillator that supplies the reference clock signal that initiates their operations.

As noted above, the memory controller 208 includes a ring oscillator that is used by the memory controller 208 when the reference clock is unavailable, i.e., during the sleep mode of the computer system 200. The control (or calibration) of the frequency of the ring oscillator and the structure of the ring oscillator are explained below with reference to FIGS. 3 and 4.

Figure 3:
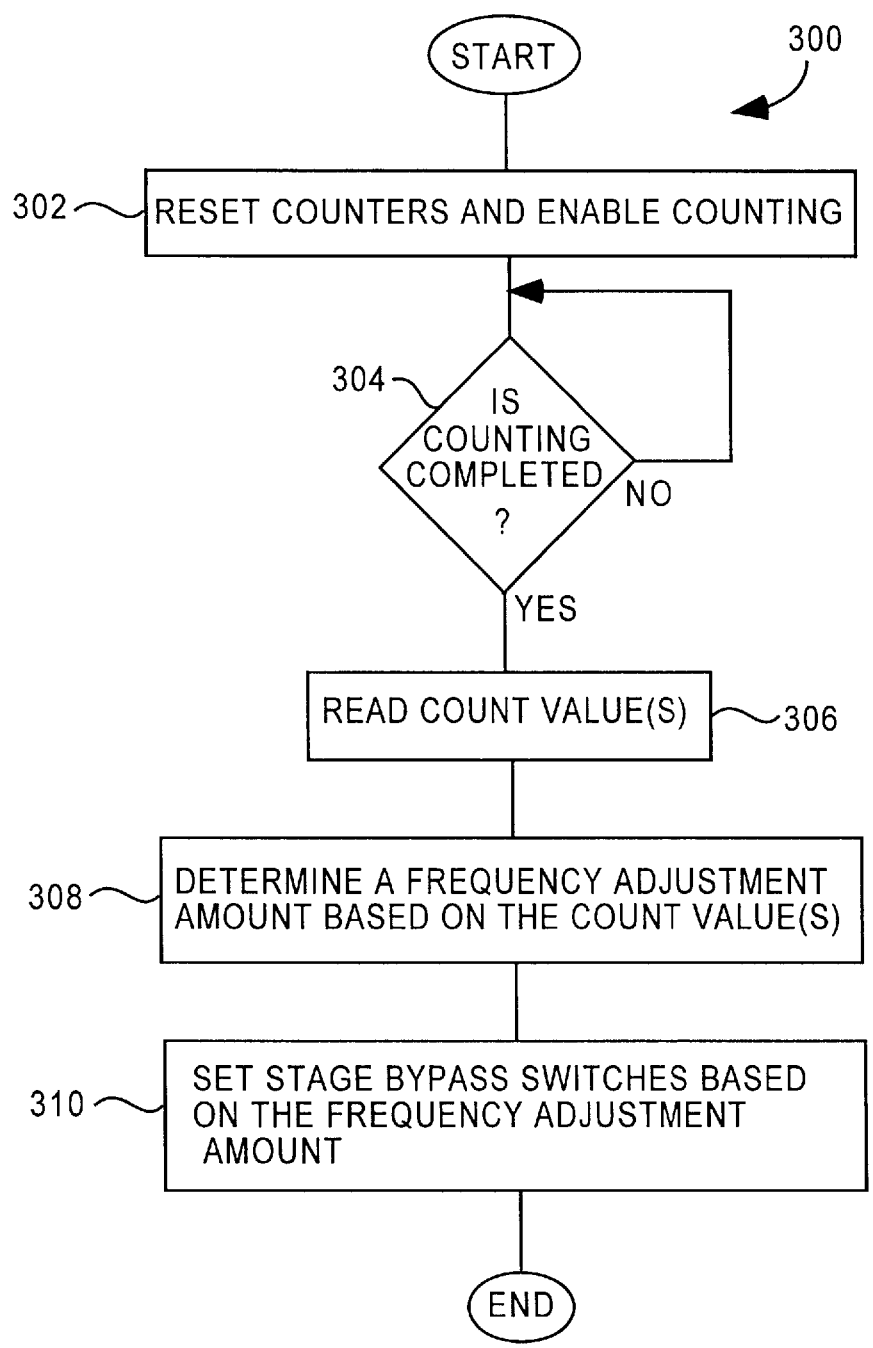
FIG. 3 is a flow diagram of oscillator calibration processing according to an embodiment of the invention.

FIG. 3 is a flow diagram of oscillator calibration processing 300 according to an embodiment of the invention. The oscillator calibration processing 300 operates to calibrate the frequency of the ring oscillator within the memory controller 208 so that it reasonably approximates the reference clock. The ring oscillator includes a number of delay stages, a bypass switch for each delay stage, and a pair of counters for assisting in the calibration of the frequency of the ring oscillator.

Initially, the oscillator calibration processing 300 resets 302 counters and then enables counting by the counters. Next, a decision block 304 determines whether the counting has been completed. While the counting is still continuing, the decision block 304 causes the oscillator calibration processing 300 to await the completion of the counting. Once the counting has completed, the count values are read 306 from the counters. Next, a frequency adjustment amount is determined 308 based on the count values. In other words, upon receiving the count values, the hardware or software implementing the oscillator calibration processing 300 is able to compute or determine the frequency adjustment amount needed to adjust frequency of the ring oscillator such that it reasonably matches the frequency of the reference clock. After the frequency amount has been determined 308, the stage bypass switches are set 310 based on the frequency adjustment amount. Following the block 310, the frequency of the ring oscillator has been calibrated to the frequency of the reference clock and thus the oscillator calibration processing 300 is complete and ends.

Figure 4:
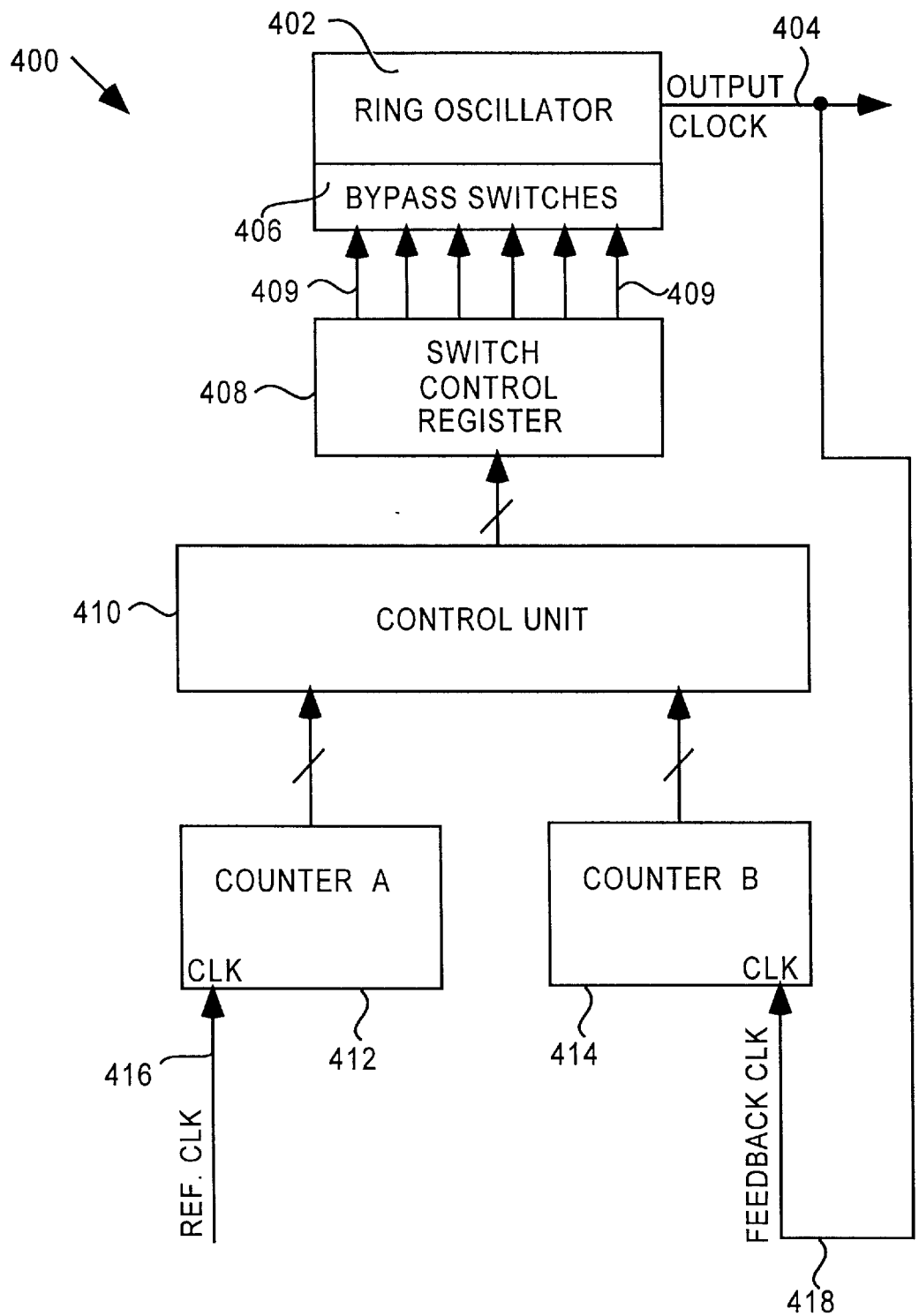
FIG. 4 is a block diagram of a ring oscillator calibration system according to an embodiment of the invention.

FIG. 4 is a block diagram of a ring oscillator calibration system 400 according to an embodiment of the invention. The ring oscillator calibration system 400 includes the ring oscillator and other hardware to facilitate the calibration of the ring oscillator. The ring oscillator calibration system 400 can be used as the internal clock (ring oscillator) within the memory controller illustrated in FIG. 2.

The ring oscillator calibration system 400 includes a ring oscillator 402 that operates to produce an output clock 404. Additional details on the construction of the ring oscillator 402 itself are described below with references to FIGS. 6 and 7. The ring oscillator calibration system 400 also includes bypass switches 406 that are individually coupled in parallel to delay elements within the ring oscillator 402. Additional details on the bypass switches 406 are discussed below with references to FIGS. 7 and 8.

The ring oscillator calibration system 400 also includes a switch control register 408 that stores a switch variable that indicates which of the bypass switches 406 should be open and which should be close. The switch control register 408 provides an output signal line 409 to each of the bypass switches 406. If the signal line 410 contains a logical "1" value, then the corresponding bypass switch is open, and if the signal line 409 contains a logic "0" value, then the corresponding bypass switch is closed.

The ring oscillator calibration system 400 further includes a control unit 410, a counter A 412 and a counter B 414. The counter A 412 receives a reference clock signal 416 at its clock input terminal (CLK) and the counter B 414 receives a feedback clock signal 418 at its clock input terminal (CLK). The feedback clock signal 418 is supplied from the output of the ring oscillator 402 (output clock 404). In this regard, the counter A 412 counts pulses associated with the reference clock signal 416, and the counter B 414 counts pulses associated with the feedback clock signal 418 produced by the ring oscillator 402. Once started, the counter A 412 and the counter B 414 count for a predetermined amount of time and then supply their count values to the control unit 410. In one embodiment, the counter A 412 is clocked at a known frequency (i.e., the reference clock signal 416) so as to provide the predetermined amount of time.

The control unit 410 (implemented in hardware and/or software) operates to determine an appropriate switch variable from the received count values, and then operates to supply the switch variable to the switch control register 408 to control the bypass switches 406. Generally, the control unit 410 operates the control bypass switches 406 so as to calibrate the ring oscillator such that its frequency is reasonable closely matched to the frequency of the reference clock. Once calibrated, the frequency produced by the ring oscillator is compensated for processing variations, and thus operates with a reasonable amount of stability such that it is suitable for use in certain designs where the oscillator or clock needed need not be highly stable but only reasonably stable. As an example, although the ring oscillator 402 after calibration becomes reasonably stable (as processing variations are compensated for), its drift characteristics still vary with temperature and voltage. Nevertheless, the ring oscillator 402 after calibration is suitable for many uses. For example, the ring oscillator 402 after calibration is suitable for use in a computer system to provide a low power, low cost, internal clock or oscillator that controls the periodic refreshing of DRAM.

The operation of the control unit 410 to obtain calibration of the ring oscillator 402 can be performed in numerous ways. One way for the control unit 410 to obtain calibration is explained in detail below with respective FIGS. 5A and 5B.

Figure 5A:
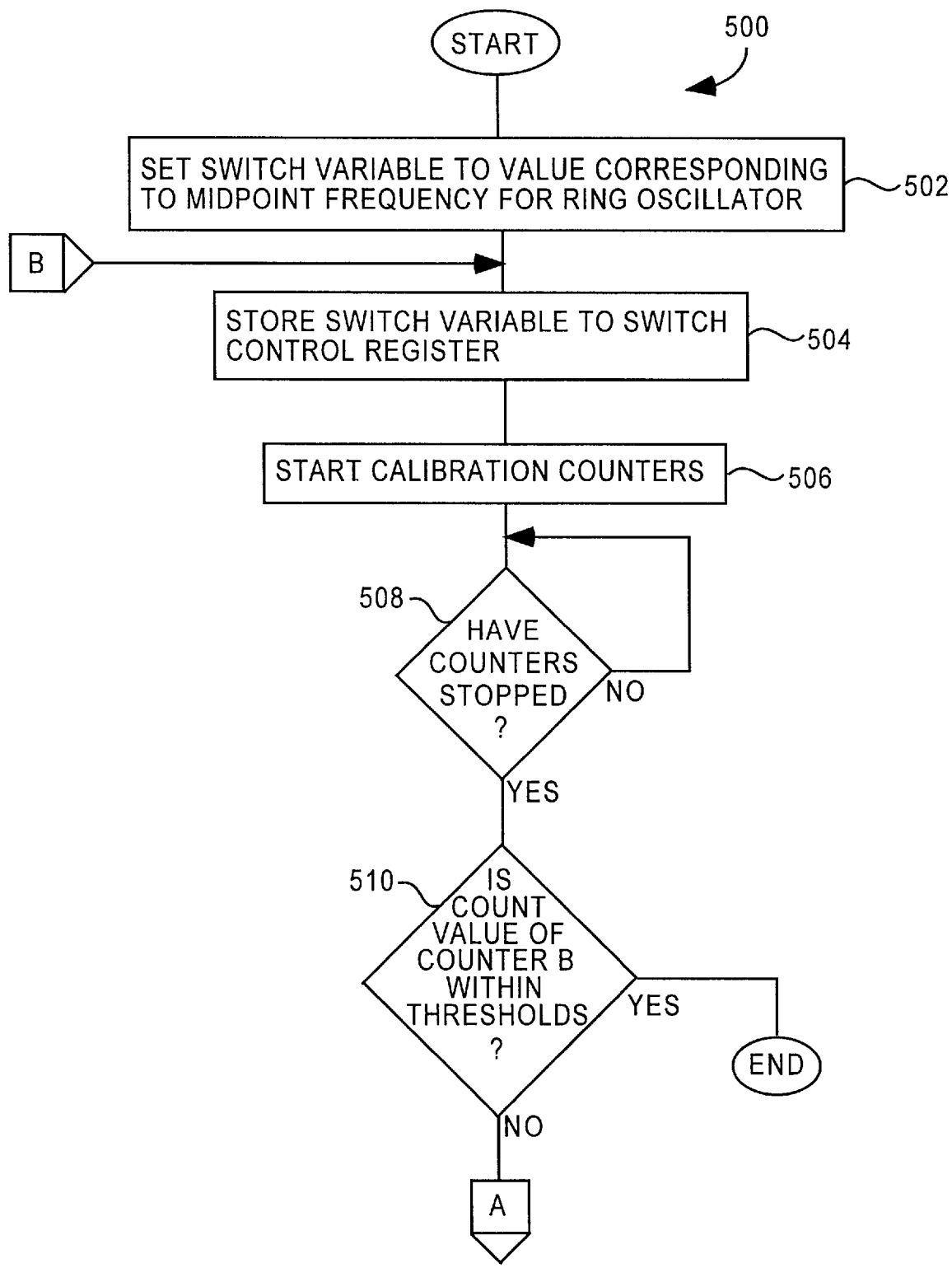
FIGS. 5A and 5B are flow diagrams of ring oscillator calibration processing according an embodiment of the invention.
Figure 5B:
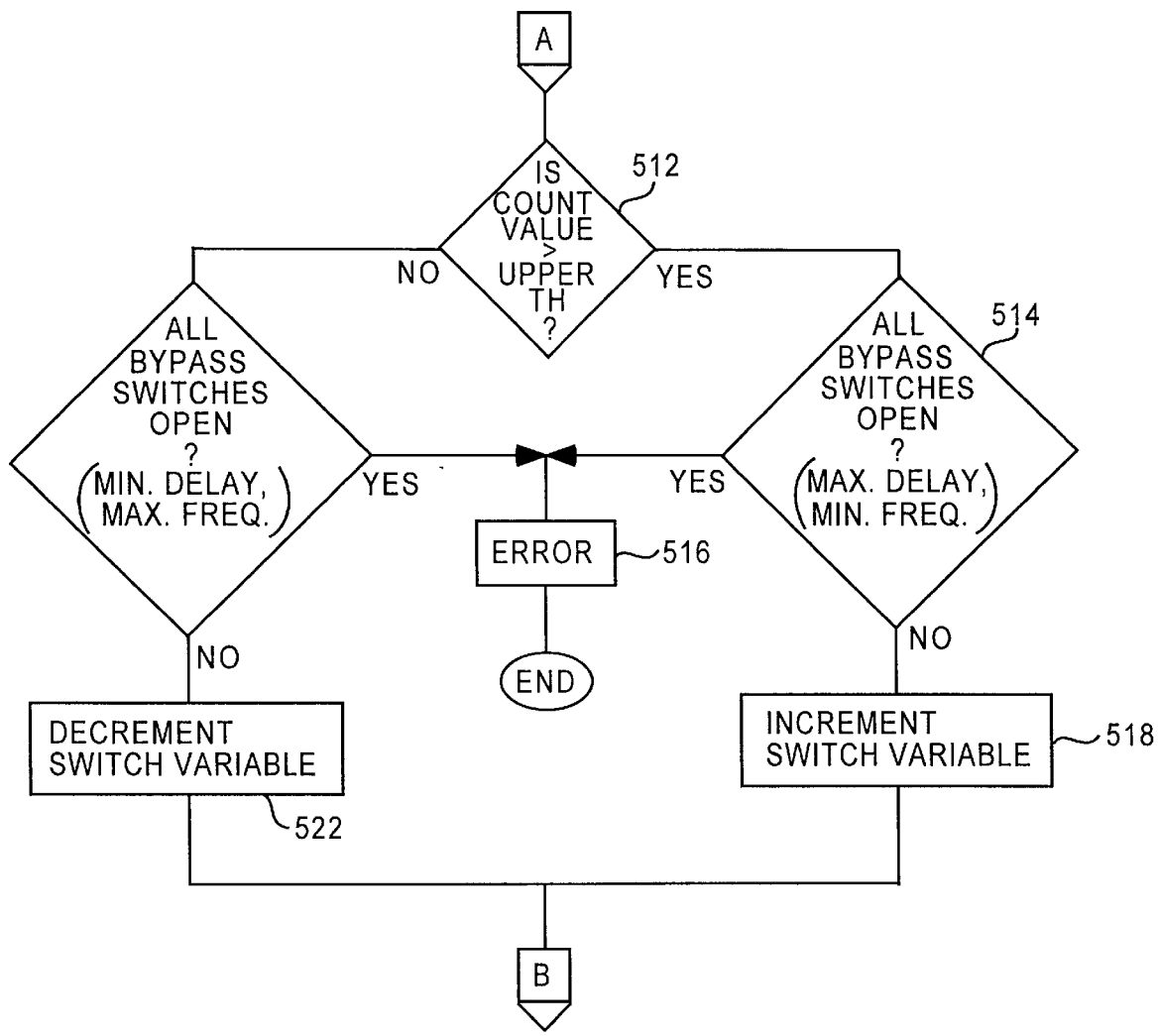

FIGS. 5A and 5B are flow diagrams of ring oscillator calibration processing 500 according to an embodiment of the invention. The ring oscillator calibration processing 500 is preferably performed by the ring oscillator calibration system 400 illustrated in FIG. 4.

Initially, the switch variable is set 502 to the value corresponding to a mid-point frequency for the ring oscillator 402. Then, the switch variable is stored 504 to the switch control register 408. Next, the calibration counters (counter A 412 and counter B 414) are started 506. One of the calibration counters counts in accordance with the reference clock and the other counts in accordance with the feedback signal. Thereafter, a decision block 508 determines whether the calibration counters have stopped. If the decision block 508 determines that the counters have not yet stopped, then the ring oscillator calibration processing 500 waits until the calibration counters have stopped. Once the calibration counters have stopped, a decision block 510 determines whether the count value of the counter counting in accordance with the feedback signal (counter B 414) is within certain predetermined thresholds. The predetermined thresholds are provided to indicates whether the frequency of the ring oscillator 402 is close enough to the desire frequency (i.e., the frequency of the reference clock) such that the ring oscillator 402 can be deemed sufficiently calibrated. If the decision block 510 determines that the count value of the counter counting in accordance with the feedback signal (counter B 414) is within the predetermined thresholds, then the ring oscillator calibration processing 500 is complete and end because the calibration process has been performed.

On the other hand, when the decision block by 510 determines that the count value of the counter counting in accordance with the feedback signal (counter B 414) is not within the predetermined thresholds, then the ring oscillator calibration processing 500 continues so that the frequency of the ring oscillator can be further adjusted to obtain better calibration. A decision block 512 next determines whether the count value of the counter counting in accordance with the feedback signal is greater than an upper threshold. In other words, the count value from the counter B 414 is compared with a value associated with the upper threshold. Preferably, the predetermined thresholds set a range in which the count value must fall within (block 510).

When the decision block 512 determines that the count value is greater than the upper threshold, then a decision block 514 determines whether the frequency of the ring oscillator is at a minimum frequency setting. If the frequency of the ring oscillator is at the minimum frequency setting, then an error 516 occurs and the ring oscillator calibration processing 500 is complete and end. Alternatively, when the decision block 514 determines that the frequency of the ring oscillator is not at the minimum frequency setting, the switch variable is incremented 518.

On the other hand, when the decision block 512 determines that the count value is less than the lower threshold, then a decision block 520 determines whether the frequency of the ring oscillator is at the maximum frequency setting. If the frequency of the ring oscillator is at the maximum frequency setting, then the error 516 also occurs and the ring oscillator calibration processing 500 ends in a hardware error. Alternatively, when the decision block 514 determines that the frequency of the ring oscillator is not at the maximum frequency setting, the switch variable is decremented 522.

Following blocks 518 and 522, the ring oscillator calibration processing 500 returns to repeat block 504 and subsequent blocks. By this processing of the ring oscillator calibration processing 500, there may be a series of passes through the calibration processing so as to achieve the calibration of the ring oscillator with respect to the reference clock. The ring oscillator calibration processing 500 is an embodiment in which the calibration processing is largely incrementally performed, thus the requirement for several passes through the calibration processing. However, other embodiments may calibrate more directly and use only a single pass.

In one embodiment, between blocks 504 and 506 of the ring oscillator calibration processing 500, an additional reset operation can be performed on the ring oscillator to ensure that no harmonics exist in the oscillator. The reset operation is performed by a reset pulse provided to the ring oscillator (see FIG. 7). The duration of the reset pulse is longer than the sum of all the delay elements of the ring oscillator.

Figure 1:
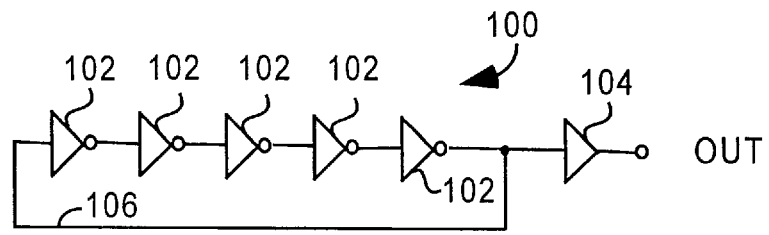
FIG. 1 is a schematic diagram of a conventional ring oscillator.
Figure 6:
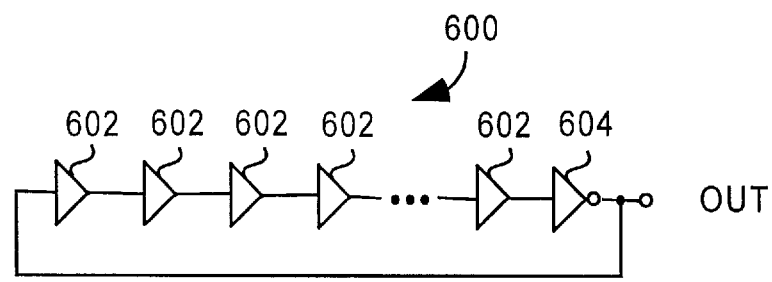
FIG. 6 illustrates a schematic diagram of a ring oscillator having a series of buffers and an inverter.
Figure 7:
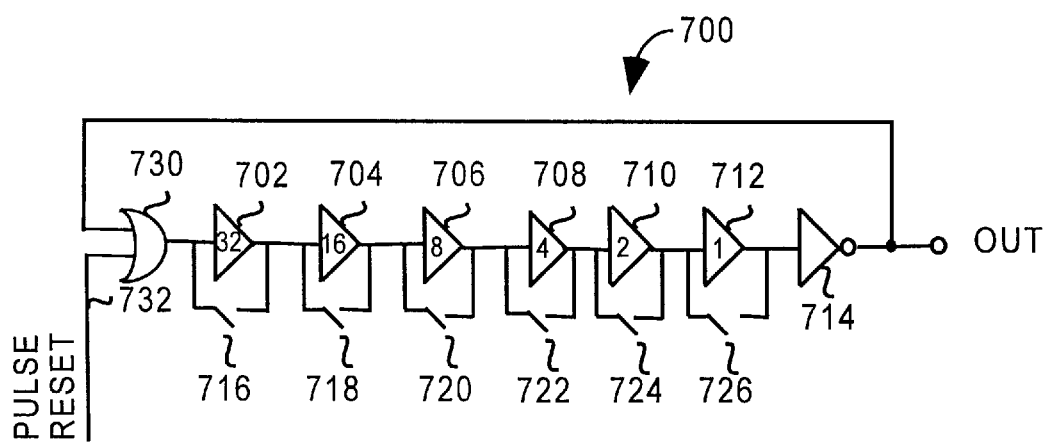
FIG. 7 is a detailed schematic diagram of a ring oscillator.

The ring oscillator 402 is preferably constructed as illustrated in FIGS. 6 and 7. FIG. 6 illustrates a schematic diagram of a ring oscillator 600 having a series of buffers 602 and an inverter 604. By using the buffers 602 and a single inverter 604, the ring oscillator 600 does not need an odd number of the buffers 602. In comparison, the ring oscillator 100 illustrated in FIG. 1 required to include an odd number of the inverters 102.

FIG. 7 is a detailed schematic diagram of a ring oscillator 700. The ring oscillator 700 is a preferred construction of the ring oscillator 402 because it limits the number of bypass switches required. The ring oscillator 700 includes six delay stages 702–712 that function as buffers but have different delays, and an inverter 714. Each delay stage 702–712 offers a different delay as indicated by the numeric value within the buffer symbol shown in FIG. 7. For example, the delay stage 702 has a delay of "32" units, whereas the delay stage 712 has a delay of only "1" unit. Hence, the delay stage 702 has a delay thirty-two times longer then the delay stage 712. Thus, each subsequent stage from left to right in the ring oscillator 700 illustrated in FIG. 7 has a delay of about ½ of the delay of the proceeding stage. Each of the delay stages 702–712 has a respective one of the bypass switches 716–726 coupled in parallel therewith. When the bypass switch is closed, the delay stage is bypassed and its delay is eliminated from the ring oscillator. Further, to obtain the delay stages with the various delays, one can form the delay stages from a series chain of buffers. The longer the delay provided by the delay stage, the more buffers there are in the chain. As an example, a single delay unit (such as provided by the delay stage 712) is typically on the order of ½ to 1 nanoseconds. The ring oscillator 700 provides a total of 63 delay units that are controllable using six bypass switches. For the reset operation, the ring oscillator 700 may also include an OR gate 730 whose output couples to the delay stage 702 and whose inputs are the output from the inverter 714 being fed back and a reset pulse 732.

Figure 8:
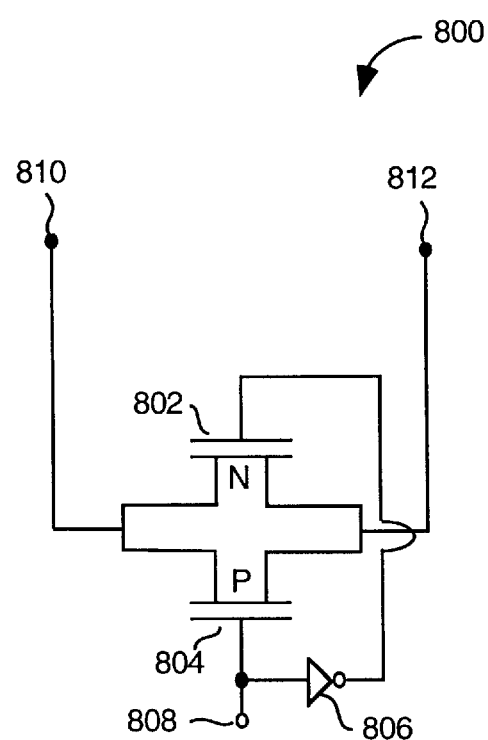
FIG. 8 is a schematic diagram of a bypass switch according to an embodiment of the invention.

FIG. 8 is a schematic diagram of a bypass switch 800 according to an embodiment of the invention using CMOS technology. The bypass switch 800 includes a first MOS transistor 802, a second MOS transistor 804, and an inverter 806. A control signal from the control unit 410 is received at a control terminal 808 of the bypass switch 800 and the bypass lines 810 and 812 couple (in parallel) across a particular one of the delay stages of the ring oscillator. When the control terminal 808 is pulled to a low potential, the first and second MOS transistors 802 and 804 conduct and thus bypasses the associated delay stage. On the other hand, when the control terminal 808 is pulled to a high potential, the first and second MOS transistors 802 and 804 do not conduct and thus the associated delay stage is not bypassed.

In one exemplary embodiment of the ring oscillator calibration system 400, the ring oscillator 402 has six delay stages and six associated bypass switches. In this exemplary embodiment, the switch control register 408 stores 6-bits, each bit controlling one bypass switch. The counter A 412 has 10-bits, and the counter B 414 has 12-bits. In this exemplary embodiment, the ring oscillator 402 is constructed with the delay stages according to FIG. 7 and the bypass switches according to FIG. 8. Hence, the switch variable used by the ring oscillator calibration processing 500 is a 6-bit binary number that is initially set to "100000" to request that the delay stages other than the first delay stage 702 be bypassed. With the ring oscillator calibration processing 500 according to this exemplary embodiment, there is no need to read the count from the counter A 412 because it always counts to 512 and then stops both of the counters 412 and 414. In this embodiment, the feedback clock is divided in half before being supplied to the counter B 414. Hence, when the feedback clock has the same frequency as the reference clock, the count value of the counter B 414 is 256. The predetermined thresholds in this embodiment are within a range between 240 (256−16) and 272 (256+16), which yield a plus or minus 6.25% accuracy with respect to the reference clock frequency.

In a portable computer environment, the voltage and temperature can change after the computer system is put into a sleep mode, thus the ring oscillator according to the invention will still undergo some frequency drift due to temperature changes. However, since fabrication processing variations associated with conventional ring oscillators has been compensated for by the calibration techniques according to the invention. Consequently, the ring oscillator according to the invention is able to be used in a computer system for the purpose timing the refreshing of DRAM. The ring oscillator also has significantly lower cost and lower power consumption than does a phase-locked-loop (PLL) or crystal based oscillator, which is particularly advantageous in the portable computer environment. Hence, the ring oscillator according to the invention consumes substantially less power than conventional approaches. As a result, a portable computer system could remain in a sleep mode for an extended period of time. For example, the extended period of time can be on the order of weeks, where as with the conventional approaches it was, at best, on the order of a few days. The ring oscillator according to the invention also requires less gates and is thus significantly easier to fabricate than other types of oscillators, (e.g., a PLL oscillator).

The impact of the remaining drift due to temperature changes or voltage changes can be controlled by re-calibrating the ring oscillator according to the invention as temperature and voltage settings change. Also, for portable computers, the computer can be woken up from a sleep mode every so often to re-calibrate the ring oscillator according to the invention.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A frequency controlled ring oscillator, comprising:
    a ring oscillator having a number of delay stages, said ring oscillator produces an output clock signal having an output frequency;
    a plurality of bypass switches, each of said bypass switches being coupled across one of the delay stages of said ring oscillator; and
    a controller for comparing the output frequency of the output clock signal with a reference frequency to produce a comparison result, and for opening or closing said bypass itches based on the comparison result.

2. The frequency controlled ring oscillator as recited in claim 1, wherein by opening or closing said bypass switches, the output frequency of the output clock signal is altered.

3. The frequency controlled ring oscillator as recited in claim 1, wherein when said controller determines that the output frequency of the output clock signal exceeds the reference frequency, said controller operates to control the opening of one or more of said bypass switches so as to decrease the output frequency.

4. The frequency controlled ring oscillator as recited in claim 3, wherein when said controller determines that the output frequency of the output clock signal is less than the reference frequency, said controller operates to control the closing of one or more of said bypass switches so as to increase the output frequency.

5. The frequency controlled ring oscillator as recited in claim 1, wherein when said controller determines that the output frequency of the output clock signal is less than the reference frequency by more than a first threshold amount, said controller operates to control the closing of one or more of said bypass switches so as to increase the output frequency.

6. The frequency controlled ring oscillator as recited in claim 5, wherein said controller determines that the output frequency of the output clock signal exceeds the reference frequency by more than a second threshold amount, said controller operates to control the opening of one or more of said bypass switches so as to decrease the output frequency.

7. The frequency controlled ring oscillator as recited in claim 1, wherein said controller comprises:
    a first counter to produce a first count value by counting in accordance with the reference frequency;
    a second counter to produce a second count value by counting in accordance with the output frequency; and
    logic for comparing the second count value against the first count value to produce the comparison result.

8. The frequency controlled ring oscillator as recited in claim 7, wherein said controller further comprises a switch control register, said switch control register couples to said bypass switches to effectuate the opening or closing of said bypass switches based on the comparison result.

9. The frequency controlled ring oscillator as recited in claim 7, wherein said first counter counts to the first count value which is a predetermined fixed count value of said first counter, and wherein said second counter counts until said first counter has reached the predetermined fixed count value thereby producing the second count value.

10. The frequency controlled ring oscillator as recited in claim 1, wherein said bypass switches are semiconductor switches.

11. The frequency controlled ring oscillator as recited in claim 1, wherein the delay stages of said ring oscillator are of different delays.

12. The frequency controlled ring oscillator as recited in claim 1, wherein each of the delay stages has a delay associated therewith that is essentially N unit delays, where N is an integer greater than 1.

13. The frequency controlled ring oscillator as recited in claim 12, wherein said ring oscillator has X delay stages, each of the X delay stages has a different delay, and wherein the X delay stages 1, 2, 3, . . . , X respectively have the N unit delays 1, 2, 6, . . . , N.

14. A frequency controlled ring oscillator, comprising:
    a ring oscillator having a number of delay stages, said ring oscillator produces an output clock signal having an output frequency;
    bypass means for bypassing one or more of the delay stages of said ring oscillator; and a controller operatively connected to said bypass means, said controller compares the output frequency of the output clock signal with a reference frequency to produce a comparison result, and controls the bypassing by said bypass means based on the comparison result.

15. The frequency controlled ring oscillator as recited in claim 14, wherein when said controller determines that the output frequency of the output clock signal differs from the reference frequency, said controller operates to control the bypassing of one or more of the delay stages so as to adjust the output frequency.

16. The frequency controlled ring oscillator as recited in claim 14, wherein when said controller determines that the output frequency of the output clock signal is less than the reference frequency by more than a first threshold amount, said controller operates to control said bypass means so as to increase the output frequency.

17. The frequency controlled ring oscillator as recited in claim 16, wherein when said controller determines that the output frequency of the output clock signal exceeds the reference frequency by more than a second threshold amount, said controller operates to control said bypass means so as to decrease the output frequency.

18. The frequency controlled ring oscillator as recited in claim 14, wherein said controller comprises:

a first counter to produce a first count value by counting in accordance with the reference frequency;

a second counter to produce a second count value by counting in accordance with the output frequency; and logic for comparing the second count value against the first count value to produce the comparison result.

19. The frequency controlled ring oscillator as recited in claim 18, wherein said controller further comprises a switch control register, said switch control register couples to said bypass means to effectuate the bypassing based on the comparison result, and wherein said first counter counts to the first count value which is a predetermined fixed count value of said first counter, and wherein said second counter counts until said first counter has reached the predetermined fixed count value thereby producing the second count value.

20. The frequency controlled ring oscillator as recited in claim 14, wherein the delay stages of said ring oscillator are of different delays.

21. The frequency controlled ring oscillator as recited in claim 14, wherein each of the delay stages has a delay associated therewith that is essentially N unit delays, where N is an integer greater than 1.

22. The frequency controlled ring oscillator as recited in claim 21, wherein said ring oscillator has X delay stages, each of the X delay stages has a different delay, and wherein the X delay stages 1, 2, 3, . . . , X respectively have the N unit delays 1, 2, 6, . . . , N.

* * * * *